United States Patent [19]
Girardeau, Jr.

[11] Patent Number: 5,486,792
[45] Date of Patent: Jan. 23, 1996

[54] METHOD AND APPARATUS FOR CALCULATING A DIVIDER IN A DIGITAL PHASE LOCK LOOP

[75] Inventor: James W. Girardeau, Jr., Austin, Tex.

[73] Assignee: Motorola, Inc., Schaumburg, Ill.

[21] Appl. No.: 399,006

[22] Filed: Mar. 6, 1995

[51] Int. Cl.⁶ ............................... H03L 7/08; H03L 7/18
[52] U.S. Cl. ........................ 331/10; 331/1 A; 331/11; 331/16; 331/17; 331/DIG. 2; 327/105; 327/156; 375/376; 455/260
[58] Field of Search ................................ 331/1 A, 4, 10, 331/11, 15, 16, 17, 25, DIG. 2; 327/105, 147, 156; 360/51; 375/120; 455/260

[56] References Cited

U.S. PATENT DOCUMENTS 4,827,225  5/1989  Lee ................................................ 331/10
5,371,480  12/1994  Hedberg et al. ............................ 331/16
5,424,687  6/1995  Fukuda ........................................ 331/11

*Primary Examiner*—David Mis

[57] ABSTRACT

A digital phase lock loop (DPLL) (10) includes a first comparator (12), a second comparator (14), a third comparator (16), and adjuster (18), feedback divider (20), a threshold unit (21), a digital oscillator (23), and a loop filter (24). The first comparator (12), loop filter (24), digital oscillator (23), and feedback divider (20) of the DPLL (10) operate to produce a controlled oscillation. The second comparator (14), third comparator (16), and adjuster (18) provide a divisor to the feedback divider (20) that allows the DPLL (10) to operate with a variety of unknown system clock (22) frequencies.

20 Claims, 5 Drawing Sheets

METHOD AND APPARATUS FOR CALCULATING A DIVIDER IN A DIGITAL PHASE LOCK LOOP

TECHNICAL FIELD OF THE INVENTION

This invention relates generally to signal processing systems and more particularly to the control of digital phase locked loops employed within the signal processing systems.

BACKGROUND OF THE INVENTION

Digital phase lock loops (DPLLs) are commonly used to create oscillatory signals in phase with but at a frequency multiple of a reference oscillation. Analog to digital (A/D) converters use DPLLs to generate high frequency oscillations used in over-sampling in a sigma-delta conversion process. Data converters that sample serial digital data and convert the data to an analog format also require a high frequency sampling oscillation to synchronize its sampling to the rate of the incoming digital data.

One particular application using a DPLL is a digital phone system. In the digital phone system, radio frequency transmissions containing digital data are transmitted between a base unit and a portable unit. The digital data coupled to the analog signal typically comprises digital data organized in a serial format as a data frame. Data frames are transmitted on a periodical basis from the base unit to the portable unit such that the portable unit may create a reference oscillation based upon the data frames and will be able to receive data consistently. Based upon the data frames, a DPLL in the portable unit creates a sampling signal based upon the reference oscillation but at a much higher frequency. A communication processor within the portable unit uses the sampling signal to convert data between the digital format and an analog format. Typically, the digital data contains voice data, and the communication processor converts the data between an analog format that is conveyed to and received from a user and the digital format that is received from and conveyed to the base unit.

DPLLs typically comprise a phase detector, a loop filter, a digital oscillator, and a feedback divider. In operation, the digital oscillator constructs a first oscillation from a fixed frequency clock. Typically, the fixed frequency clock is somewhere in the 10 megahertz range and the first oscillation is in the one megahertz range although these frequencies change from installation to installation. The first oscillation inputs to the divider which creates both a feedback oscillation and a sampling signal that is use by the communication processor in the sampling process. The phase detector and loop filter operate to force the feedback oscillation into phase with the reference oscillation. In this fashion, the first oscillation and sampling signal are also in phase with the reference oscillation.

Traditionally, specifications for the DPLL required that the fixed frequency clock be a certain frequency and have a certain tolerance in order to create the correct feedback signal and sampling signal. Thus, the selection of a particular fixed frequency clock has been important. Clocks having differing frequencies are commonly used today and could otherwise be available to serve as the fixed frequency clock. Unfortunately, because DPLLs have heretofore been designed to operate with a specific fixed frequency clock to produce the feedback oscillation, the limitation has been a drawback.

Thus, there exists a need in the art for an apparatus and method for allowing a DPLL to function properly with a variety of fixed frequency clock frequencies such that a single DPLL design could be used in a variety of installations.

DESCRIPTION OF PREFERRED EMBODIMENTS

Generally, the present invention provides an apparatus and method for determining a feedback divider ratio in a Digital Phase Lock Loop ("DPLL"). This is accomplished by continually monitoring the operation of a DPLL to determine whether drift in the feedback signal is caused by an improper feedback divider ratio or simply by drift of one or more of the fixed frequency signals associated with the DPLL. Having detected such a drift, the DPLL adjusts a feedback divisor accordingly, thereby bringing the resulting oscillation within a given tolerance. Thus, the present invention allows a single DPLL to be used with a variety of fixed frequency clocks and to correct for frequency drifts.

Figure 1:
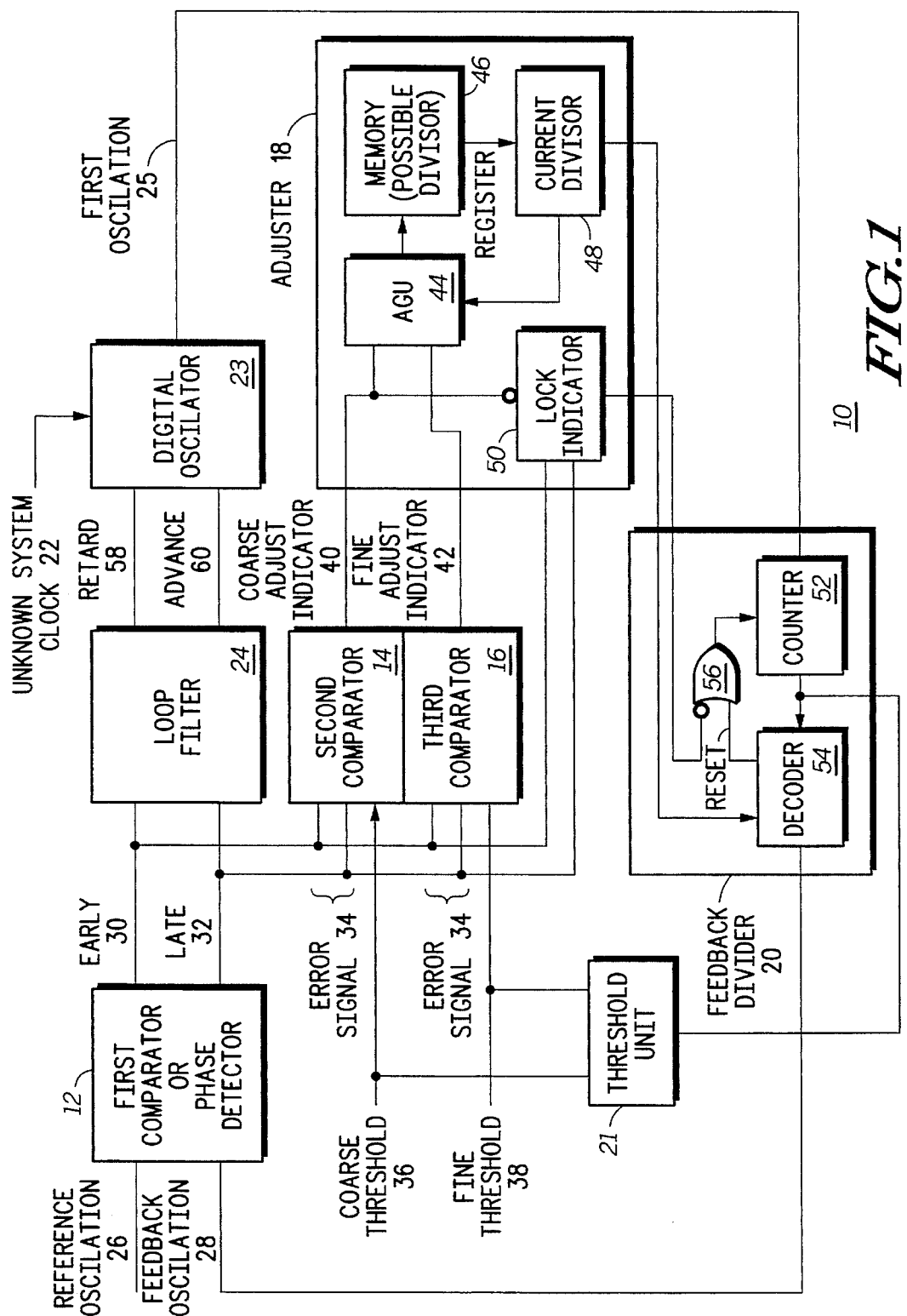
FIG. 1 illustrates a block diagram of a digital phase lock loop and divisor determiner in accordance with the present invention.

FIG. 1 illustrates a DPLL 10 that includes a first comparator, or phase detector, 12, a second comparator 14, a third comparator 16, an adjuster 18, a feedback divider 20, a threshold unit 21, a digital oscillator 23, and a loop filter 24. The operation of the DPLL 10 aside from those portions incorporating the teachings of the present invention is substantially identical to prior DPLLs. Thus, those skilled in the art understand the operation of those components and a detailed description of their operation is not produced herein.

The first comparator 12 compares the relative phase between a reference oscillation 26 and a feedback oscillation 28 and produces an output signal based upon such comparison. When the feedback oscillation 28 leads the reference oscillation 26 in phase, the first comparator 12 produces an early error signal 30 upon receipt of the reference oscillation 26. However, when the reference oscillation 26 leads the feed back oscillation 28 in phase the first comparator 12 produces a late error signal 32 upon receipt of the reference oscillation 26. Either an early error signal 30 or late error signal 32 therefore is produced on every cycle of the reference oscillation 26.

The loop filter 24 receives the early error signal 30 and the late error signal 32 and accumulates the signals in a count up and a count down manner to determine whether to adjust the phase of the first oscillation produced by the DPLL 10. When the loop filter 24 determines that the feed back oscillation 28 is leading the reference oscillation 26 in phase so as to exceed a predetermined limit, the loop filter 24 produces a retard 58 to the digital oscillator 23. When the loop filter 24 determines that the feedback oscillation is lagging the reference oscillation 26 in phase so as to exceed a predetermined limit, the loop filter 24 issues an advance 60 to the digital oscillator. Typically, the early error signal 30 serves as a count up input to a counter (not shown) while the late error signal 32 serves as a count down input to the counter. When the counter reaches a positive count limit, the loop filter 24 issues a retard 58. Conversely, when the counter reaches a negative count limit, the loop filter 24 issues an advance 60.

The digital oscillator 23 constructs the first oscillation 25 based upon an unknown system clock 22. The unknown system clock 22 may be of any of a plurality of frequencies generally available. The digital oscillator 23 preferably comprises a counter (not shown) and a decoder (not shown). During a normal cycle, the counter counts up to a certain number, issues a first oscillation 25 cycle, and is reset by the decode. In a typical installation, for example, the digital oscillator 23 issues a rising edge of the first oscillation 25 pulse every 10 cycles of the unknown system clock 22. However, when the digital oscillator 23 receives a retard 58, it counts to 11 cycles of the unknown system clock 22 before it issues a rising edge of the first oscillation 25. Alteratively, when the digital oscillator 23 receives an advance 60, it counts up only 9 cycles of the unknown system clock 22 cycles before issuing a rising edge of the first oscillation 25. Thus, in addition to consistently constructing the first oscillation 25, the digital oscillator 23 selectively advances or retards the phase of the first oscillation 25 depending upon the retard 58 and advance 60 signals.

The feedback divider 20 divides the first oscillation 25 to produce the feedback oscillation 28. Preferably, the feedback divider comprises a counter 52 and a decoder 54. In operation, the counter 52 counts up to a divisor value, at which point the decoder 54 resets the counter 52 and outputs a rising edge of the feedback oscillation 28. The divisor value is provided to the decoder 54 by the adjuster 18 and may be adjusted by the adjuster 18 as required. The feedback divider 20 also includes an OR gate which allows the adjuster 18 to continually reset the counter 52 during a reset cycle of the DPLL 10. When continually reset, the counter 52 does not count up and thus, the feedback divider 20 does not produce the feedback oscillation 28.

The second comparator 14, third comparator 16, and adjuster 18 serve to adjust the divisor used by the feedback divider 20 so as to force the frequency of the feedback oscillation 28 to match the frequency of the reference oscillation 26. In this fashion, the components compensate for differing operating frequencies of the unknown system clock 22 and allow the DPLL of the present invention to be provided with unknown system clocks 22 having any of a variety of operating frequencies.

The second comparator 14 preferably compares an error signal 34 to a coarse threshold 36 and produces a coarse adjust indicator 40 when the error signal 34 compares unfavorably to the coarse threshold 36. Preferably, the error signal 34 comprises both the early error signal 30 and late error signal 32. These signals are preferably in phase with the reference oscillation 26 and produced on each cycle of the reference oscillation 26. In the present embodiment, an error signal 34 compares unfavorably to the coarse threshold 36 when the error signal 34 exceeds the coarse threshold 36.

The third comparator 16 compares an error signal 34 with a fine threshold 38 and produces a fine adjust indicator 42 when the error signal 34 compares unfavorably with the fine threshold 38. Preferably, the error signal 34 compares unfavorably with the fine threshold 38 when the error signal 34 exceeds the fine threshold 38. The error signal 34 preferably comprises both the early error signal 30 and the late error signal 32 produced by the first comparator 12 so that a comparison is made on every cycle of the reference oscillation 26.

The threshold unit 21 constructs both the coarse threshold 36 and the fine threshold 38. Preferably, the threshold unit 21 uses the output of the counter 52 in the feedback divider 20 to produce the coarse and fine thresholds. In essence, the thresholds 36 and 38 are square wave pulses that have a fixed duration and are synchronized to the output of the counter 52. The edges of the thresholds are compared to the edges of the error signal 34. When an edge of the error signal 34 is beyond an edge of the threshold, the comparison is unfavorable and an adjustment indicator 40 or 42 is generated. Preferably, both the coarse adjust indicator 40 and fine adjust indicator 42 comprise two bits of data so that relative phase position and difference between the reference oscillation 26 and feedback oscillation 28 may be conveyed to the adjuster 18. A more detailed discussion of the thresholds will be presented below with reference to FIG. 2.

The adjuster 18 receives the coarse adjust indicator 40, the fine adjust indicator 42, the early error signal 30, and the late error signal 32 as its inputs. Preferably, the adjuster 18 comprises an adjust generation unit 44 (AGU), memory 46 containing possible divisors, a register 48 containing a current divisor, and a lock indicator 50. The adjuster 18 operates to select a proper divisor from a plurality of divisors, to furnish the divisor to the feedback divider so that the frequency of the feedback oscillation 28 matches the frequency of the reference oscillation 26. In this fashion, the DPLL 10 of the present invention may operate with any of a variety of unknown system clocks 22.

In operation, the adjuster 18 initially selects a first coarse threshold from a variety of coarse thresholds and initiates the operation of the DPLL 10 so that the feedback oscillation 28 is produced. At startup, the loop filter 24, digital oscillator 23, and feedback divider 20 are preferably all reset so that the DPLL 10 starts its operation from a reference point. Initially, then, the feedback oscillation 28 is produced based upon the first coarse divisor provided by the adjuster 18 to the feedback divider 20.

Upon each cycle of the reference oscillation 26, an error signal 34 is compared to both the coarse threshold 36 and the fine threshold 38. If the error signal 34 compares unfavorably to the coarse threshold 36, the second comparator 14 produces a coarse adjust indicator 40. If the error signal 34 compares unfavorably to the fine threshold 38, the third comparator 14 produces a fine adjust indicator 42. Preferably, the error signal 34 compares unfavorably to a threshold signal when it exceeds the threshold signal.

When the coarse adjust indicator 40 is produced, the fine adjust indicator 42 may also be produced but is ignored by the adjuster 18. In such a case, the AGU 44 determines that the current divisor is incorrect, and, based upon the coarse adjust signal 40, adjusts the coarse divisor by preferably selecting a new coarse divisor from memory 46 and placing the new coarse divisor in the register 48 to become the current divisor. Because the coarse adjust indicator 40 provides information on relative phase, the AGU 44 determines whether to select a larger or smaller divisor. After a coarse adjust indicator 40 has been produced, lock indicator 50 locks out OR gate 56 to place the DPLL 10 in a reset state until the next receipt of a reference oscillation 26. In the reset state, the counter 52 is continually reset to prevent the feedback oscillation 28 from being produced. However, on the next receipt of a reference oscillation 26 the DPLL 10 is activated using the new coarse divisor 48.

When a coarse adjust indicator 40 is not produced, but a fine adjust indicator 42 is produced, the AGU 44 adjusts the divisor by preferably selecting a new fine divisor and places it into the register 48. However, when the fine adjust indicator 42 is produced, the counter 52 continues to operate and is not reset by the lock indicator 50. Thus, the DPLL 10 is allowed to produce the feedback oscillation 28 continually.

When neither the coarse adjust indicator 40 or the fine adjust indicator 42 is produced, the divisor stored in the register 48 remains unchanged and the operation of the DPLL 10 continues. Thus, the present invention discloses a DPLL 10 that may be used with any of a variety of unknown system clock 22 frequencies. The DPLL 10 determines a correct divisor upon startup, corrects for frequency drifts, and is able to operate in noisy conditions.

Figure 2:
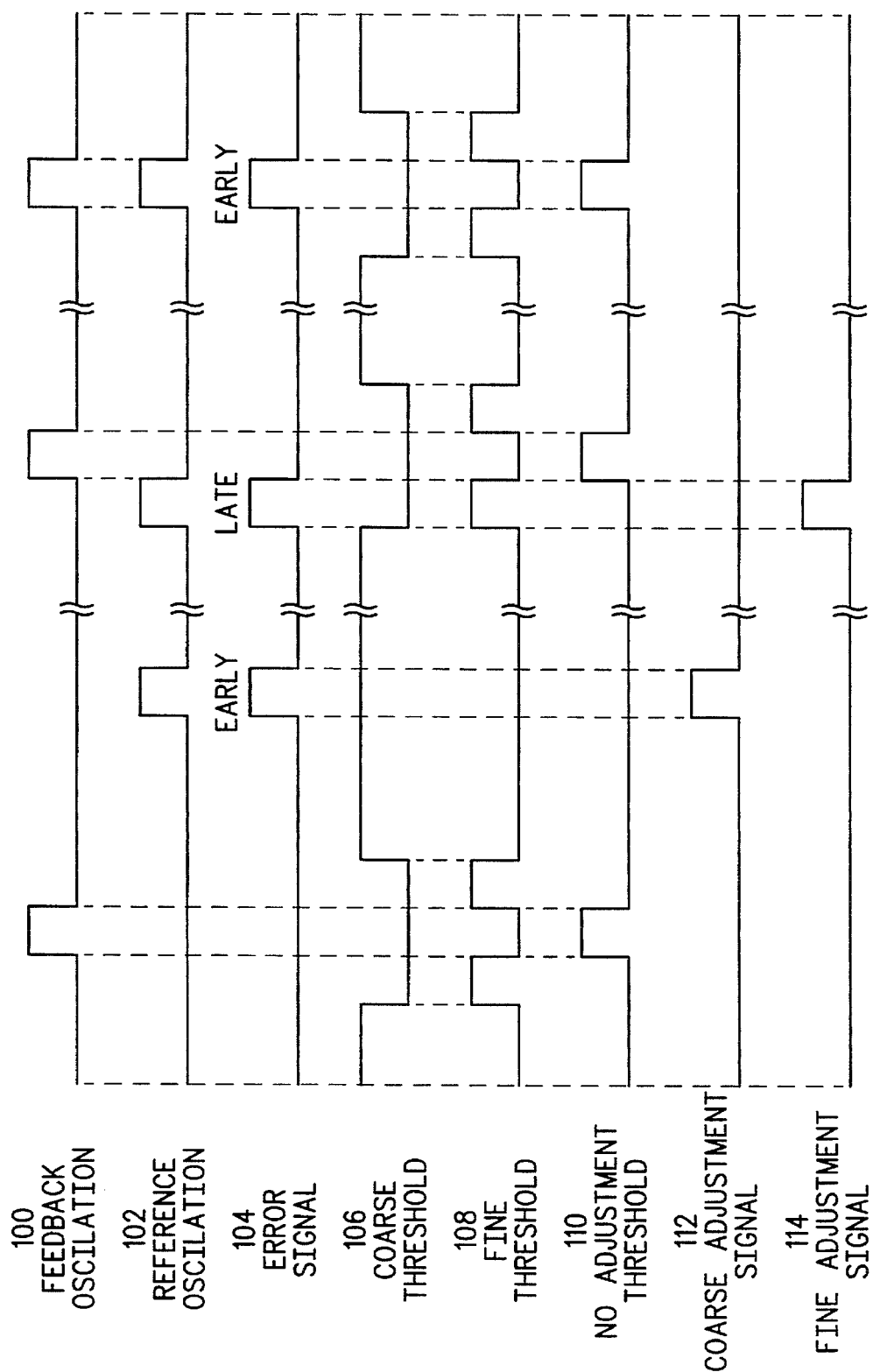
FIG. 2 illustrates oscillatory, error, threshold, and adjust signals of the digital phase lock loop and divisor determiner in accordance with the present invention.

FIG. 2 illustrates the relationship between the oscillations, the error signals, and the thresholds. Feedback oscillation 100 is produced by the DPLL 10 as was previously discussed and, ideally, is phase locked and frequency locked with the reference oscillation 102 which is produced external to the DPLL 10. As is shown, error signal 104 preferably comprises both the early error signal 30 and the late error signal 32 and is produced on every cycle of the reference oscillation 102 and in phase with the reference oscillation 102. The coarse threshold 106, fine threshold 108, and no adjustment threshold 110 signals are produced by the threshold unit 21 and provide a basis to the adjuster 18 in order to determine whether to adjust the divisor. When an error signal 104 is received from the coarse threshold 106 that compares unfavorably to the coarse threshold 36, a coarse divisor adjustment is performed. Preferably, an error signal 104 compares unfavorably when it exceeds the coarse threshold—when the coarse threshold signal is logic high. Further, preferably, an adjustment of the coarse threshold is accomplished by selecting a new coarse divisor. Such is the sequence of events in the left most portion of FIG. 2. Thus, coarse adjust signal 112 is produced, the adjuster 18 receives the signal, and selects a new coarse divisor. When an early error signal 30 serves as the error signal 104, a next larger coarse divisor is preferably selected while, when a late error signal 32 serves as the error signal 104, a next smaller coarse divisor is preferably selected.

Referring to the central portion of FIG. 2, when an error signal 104 and the fine threshold 108 are logic high, a fine adjust signal 114 is produced. The adjuster 18 receives the fine adjust signal 114 and selects a new fine divisor accordingly. When an early error signal 30 serves as the error signal 104, a next larger fine divisor is preferably selected while when a late error signal 32 serves as the error signal 104, a next smaller fine divisor is preferably selected.

Referring now to the right most portion of FIG. 2, when the error signal 104 is produced during an active high portion of a no adjust threshold signal 110, neither the coarse adjust signal 112 or the fine adjust signal 114 is produced. Therefore, the divisor that was previously used is retained through at least the next cycle of the feedback oscillation 100.

Figure 3:
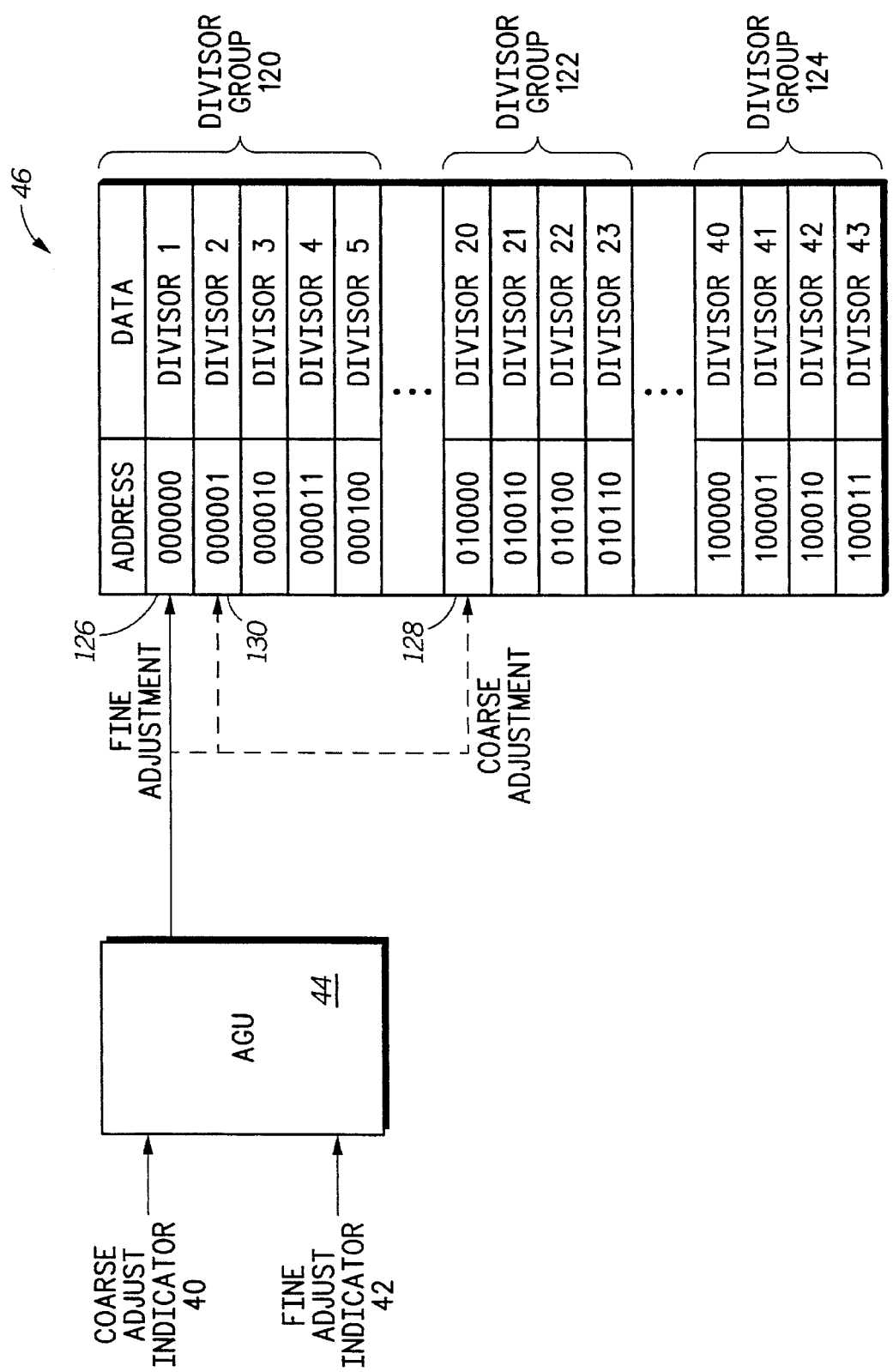
FIG. 3 illustrates divisor selection logic in accordance with the present invention.

FIG. 3 illustrates a preferred organization of divisors, listed as divisor 1 through divisor 44, in memory 46 and a preferred technique of accessing the divisors used by the DPLL 10. As is shown, the divisors preferably reside within divisor groups in a sequential manner based upon divisor value. For example, a first divisor group 120 may include 5 divisors, a second divisor group 122 may include 4 divisors, and a third group 124 may include 4 divisors. One particular divisor within a divisor group is preferably designated as a coarse divisor. For example, Divisor 1 in divisor group 120 and Divisor 20 in divisor group 122 are designated coarse divisors.

In a particular example, at start up, a first coarse divisor 126 (Divisor 1) is selected from the first divisor group 120 and the DPLL 10 operates accordingly. When the AGU 44 receives a coarse adjust indicator 40, it selects a new coarse divisor 128 from a different divisor group 122. Alternatively, when the AGU 44 receives a fine adjust indicator 42 it selects a new fine divisor 130 from the same divisor group 120 as the coarse divisor 126, preferably one divisor position away. On a subsequent cycle, if another fine adjust indicator 42 were received a new fine divisor in the same divisor group 120 would be selected.

Figure 4:
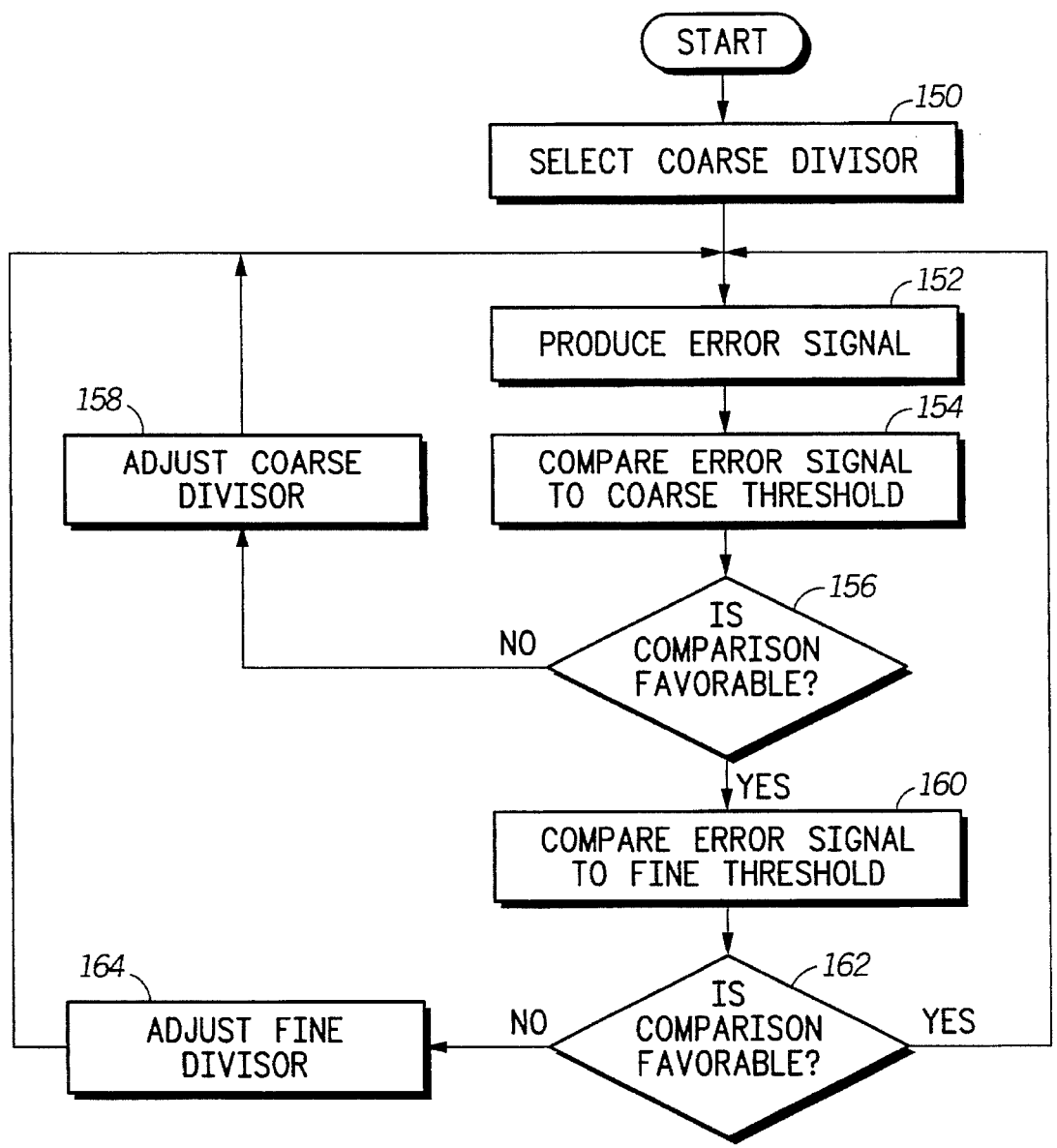
FIG. 4 illustrates a logic diagram of a first method in accordance with the present invention for determining a divisor of a digital phase lock loop.

FIG. 4 illustrates a first preferred method of the present invention. The first step in the present invention at block 150 includes selecting a coarse divisor. From block 150 the method proceeds to block 152 where, upon a triggering event, an error signal is produced by comparing a reference oscillation 26 with a feedback oscillation 28. A triggering event may be start-up, change in the reference oscillation, a power interrupt and/or a toggling of the unknown system clock. Then, at block 154 the error signal is compared with a coarse threshold. At decision block 156 it is determined if the comparison of block 154 is favorable. If the comparison is not favorable, the method proceeds to block 2158 wherein a coarse divisor adjustment is provided to a feedback divider. From block 158, the method proceeds to block 152 where another error signal is produced. If, at decision block 156, the comparison is favorable, the method proceeds to block 160 where the error signal is compared to a fine threshold. Next, at block 162, it is determined whether the comparison between the error signal and the fine threshold are favorable. If the comparison is not favorable, the method proceed to block 164 wherein a fine divisor adjustment is provided to the feedback divider 20. From block 164, the method returns to block 152. If, at block 162, the comparison was favorable, the method returns to block 152 where another error signal is produced. The method of the present invention allows as single DPLL 10 to be used with a variety of differing unknown system clocks 22. In this manner the DPLL 10 is much more flexible in its operation than those previously known in the art.

Figure 5:
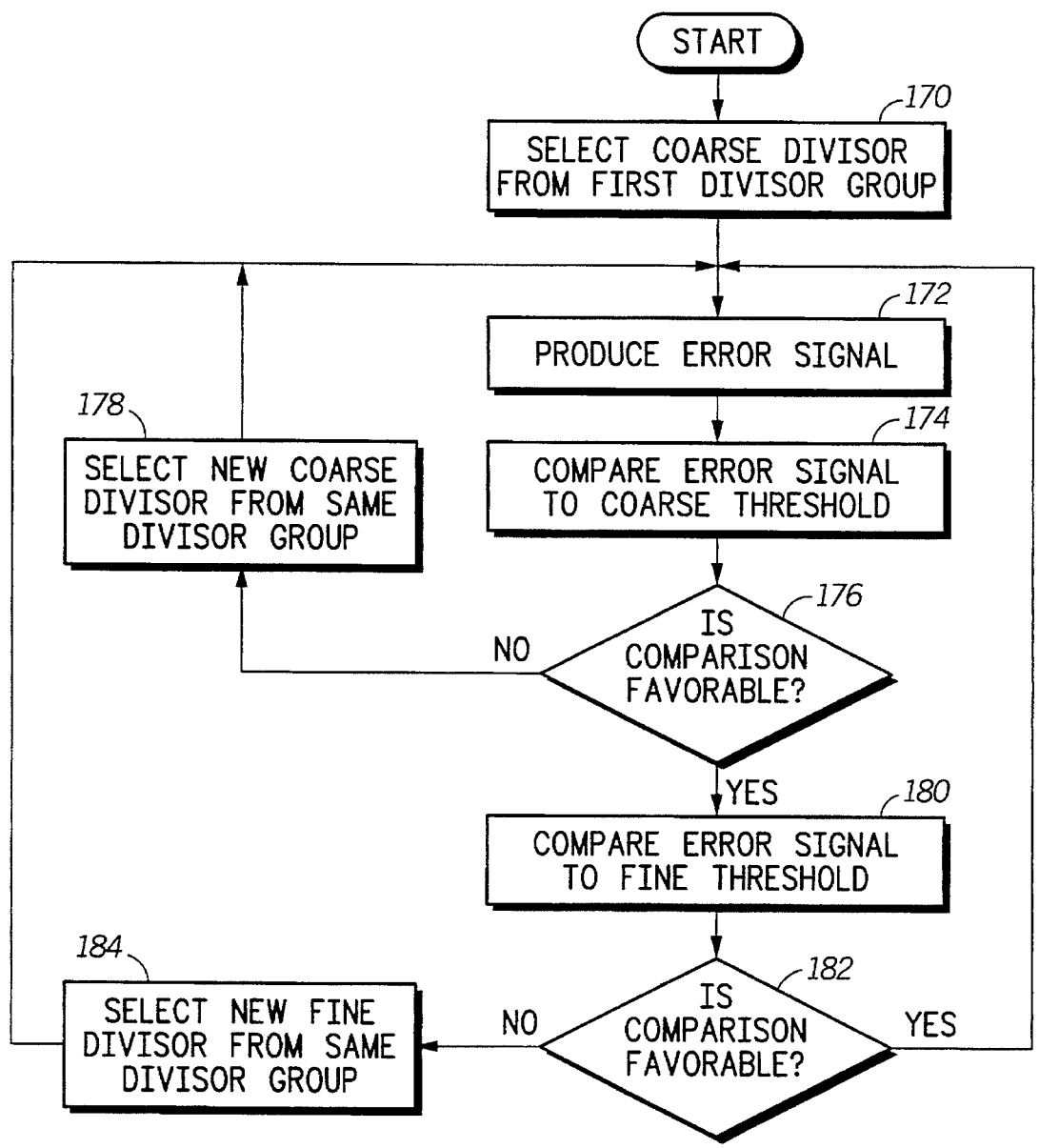
FIG. 5 illustrates a logic diagram of a second method in accordance with the present invention for determining a divisor of a digital phase lock loop.

FIG. 5 illustrates an alternative preferred method of the present invention. The first step of the alternative method of the present invention at block 170 includes selecting a coarse divisor from the first divisor group. As a next step at block 172 an error signal is produced upon a triggering event by comparing a reference oscillation 26 with the feedback oscillation 28. Next, at block 174, the error signal is compared to a coarse threshold. At decision 176, it is determined whether the comparison is favorable. If the comparison is not favorable, the method returns to block 178 wherein a new coarse divisor is selected from a new divisor group. From block 178 control returns to block 172. If, at block 176 the comparison is favorable, the method proceeds to block 180. At block 180, the error signal is compared to a fine threshold. Next, at decision block 182, it is determined whether or not the comparison is favorable. If the comparison was not favorable, the method proceeds to block 184 where a new divisor is selected, the new divisor being from a same divisor group as the previous divisor. From block 184, the method returns to block 172. If, at block 182 the comparison is favorable, the method also returns to block 172. Preferably, the comparison performed at block 176 and block 182 compares the error signal to the thresholds and determines that the comparison is favorable only if the error signal does not exceed the specific threshold being compared.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A method for determining a feedback divider ratio in a phase lock loop from an unknown reference clock, the method comprising the steps of:
   (a) upon a triggering event, comparing a reference oscillation with a feedback oscillation to produce an error signal;
   (b) comparing the error signal with a coarse threshold; and
   (c) when the error signal compares unfavorably to the coarse threshold, providing a coarse divisor adjustment to a feedback divider.

2. The method of claim 1 further comprising the steps of:
   (d) when the error signal compares favorably to the coarse threshold, comparing the error signal with a fine threshold; and
   (e) when the error signal compares unfavorably to the fine threshold, providing a fine divisor adjustment to the feedback divider.

3. The method of claim 1 further comprising the steps of:
   (d) receiving a subsequent feedback oscillation, wherein the subsequent feedback oscillation is based on the unknown reference clock and the coarse divisor adjustment;
   (e) comparing the subsequent feedback oscillation with the reference oscillation to produce a second error signal;
   (f) comparing the second error signal with the coarse threshold; and
   (g) when the second error signal compares unfavorably to the coarse threshold, providing a second coarse divisor adjustment to a feedback divider.

4. The method of claim 1 further comprising the steps of:
   (d) receiving a subsequent feedback oscillation, wherein the subsequent feedback oscillation is based on the unknown reference clock and the coarse divisor adjustment;
   (e) comparing the subsequent feedback oscillation with the reference oscillation to produce a second error signal;
   (f) when the second error signal compares favorably to the coarse threshold, comparing the error signal with a fine threshold; and
   (g) when the error signal compares unfavorably to the fine threshold, providing a fine divisor adjustment to the feedback divider.

5. The method of claim 1, wherein step (c) further comprises determining that the error signal compares unfavorably to the coarse threshold when the error signal exceeds the coarse threshold.

6. A method for determining a divisor for a feedback divider of a phase lock loop from an unknown reference clock, the method comprising the steps of:
   (a) upon a triggering event, comparing a reference oscillation with a feedback oscillation to produce an error signal, wherein the feedback oscillation is produced using a first divisor;
   (b) comparing the error signal with a coarse threshold; and
   (c) when the error signal compares unfavorably with the coarse threshold, selecting a second divisor, wherein the second divisor is in a different divisor group than the first divisor.

7. The method of claim 6 further comprising the steps of:
   (d) when the error signal compares favorably to the coarse threshold, comparing the error signal with a fine threshold; and
   (e) when the error signal compares unfavorably to the fine threshold, selecting a first fine divisor wherein the first fine divisor is in a same divisor group as the first divisor.

8. The method of claim 6 further comprising the steps of:
   (d) receiving a subsequent feedback oscillation, wherein the subsequent feedback oscillation is based on the unknown reference clock and the second coarse divisor;
   (e) comparing the subsequent feedback oscillation with the reference oscillation to produce a second error signal;
   (f) comparing the second error signal with the coarse threshold; and
   (g) when the second error signal compares unfavorably to the coarse threshold, selecting a third divisor, wherein the third coarse divisor is in a different divisor group than the second divisor.

9. The method of claim 6 further comprising the steps of:
   (d) receiving a subsequent feedback oscillation, wherein the subsequent feedback oscillation is based on the unknown reference clock and the second divisor;
   (e) comparing the subsequent feedback oscillation with the reference oscillation to produce a second error signal;
   (f) when the second error signal compares favorably to the coarse threshold, comparing the error signal with a fine threshold; and
   (g) when the error signal compares unfavorably to the fine threshold, selecting a second fine divisor from a same divisor group as the second divisor.

10. The method of claim 6, wherein step (c) further comprises determining that the error signal compares unfavorably to the coarse threshold when the error signal exceeds the coarse threshold.

11. An apparatus for determining a feedback divider ratio in a phase lock loop from an unknown reference clock comprising:
    a first comparator, wherein, upon a triggering event, the first comparator compares a reference oscillation with a feedback oscillation to produce an error signal;
    a second comparator, wherein the second comparator compares the error signal with a coarse threshold; and
    an adjuster, wherein, when the error signal compares unfavorably to the coarse threshold, the adjuster provides a coarse divisor adjustment to a feedback divider.

12. The apparatus of claim 11 further comprising:
    a third comparator, wherein the third comparator compares the error signal with a fine threshold when the error signal compares favorably to the coarse threshold; and wherein, when the error signal compares unfavorably to the fine threshold, the adjuster provides a fine divisor adjustment to a feedback divider.

13. The apparatus of claim 11 further comprises:

a subsequent feedback oscillation, wherein the subsequent feedback oscillation is based on the unknown reference clock and the coarse divisor adjustment, wherein the first comparator compares the subsequent feedback oscillation with the reference oscillation to produce a second error signal;

wherein the second comparator compares the second error signal with the coarse threshold; and wherein, when the second error signal compares unfavorably to the coarse threshold, the adjuster provides a second coarse divisor adjustment to a feedback divider.

14. The apparatus of claim 11 further comprises:

a subsequent feedback oscillation, wherein the subsequent feedback oscillation is based on the unknown reference clock and the coarse divisor adjustment, wherein the first comparator compares the subsequent feedback oscillation with the reference oscillation to produce a second error signal;

wherein the second comparator compares the second error signal with the coarse threshold;

wherein, when the second error signal compares favorably to the coarse threshold, a third comparator compares the error signal with a fine threshold; and wherein, when the error signal compares unfavorably to the fine threshold, the adjuster provides a fine divisor adjustment to a feedback divider.

15. The apparatus of claim 11 wherein the second comparator further comprises a first input that receives the error signal and a second input that receives the coarse threshold, wherein the error signal compares unfavorably to the coarse threshold when the error signal exceeds the coarse threshold.

16. An apparatus for determining a feedback divider ratio in a phase lock loop from an unknown reference clock comprising:

a first comparator, wherein, upon a triggering event, the first comparator compares a reference oscillation with a feedback oscillation to produce an error signal, wherein the feedback oscillation is produced using a first divisor;

a second comparator, wherein the second comparator compares the error signal with a coarse threshold; and an adjuster, wherein, when the error signal compares unfavorably to the coarse threshold, the adjuster selects a second divisor that is in a different divisor group than the first divisor.

17. The apparatus of claim 16 further comprising:

a third comparator, wherein the third comparator compares the error signal with a fine threshold when the error signal compares favorably to the coarse threshold; and wherein, when the error signal compares unfavorably to the fine threshold, the adjuster selects a first fine divisor, divisor wherein the first fine divisor is in a same divisor group as the first divisor.

18. The apparatus of claim 16 further comprises:

a subsequent feedback oscillation, wherein the subsequent feedback oscillation is based on the unknown reference clock and the second divisor, wherein the first comparator compares the subsequent feedback oscillation with the reference oscillation to produce a second error signal;

wherein the second comparator compares the second error signal with the coarse threshold; and wherein, when the second error signal compares unfavorably to the coarse threshold, the adjuster provides a third coarse divisor to a feedback divider.

19. The apparatus of claim 16 further comprises:

a subsequent feedback oscillation, wherein the subsequent feedback oscillation is based on the unknown reference clock and the second divisor, wherein the first comparator compares the subsequent feedback oscillation with the reference oscillation to produce a second error signal;

wherein the second comparator compares the second error signal with the coarse threshold;

wherein, when the second error signal compares favorably to the coarse threshold, a third comparator compares the error signal with a fine threshold; and wherein, when the error signal compares unfavorably to the fine threshold, the adjuster selects a second fine divisor that is in a same divisor group as the second divisor.

20. The apparatus of claim 16 wherein the second comparator further comprises a first input that receives the error signal and a second input that receives the coarse threshold, wherein the error signal compares unfavorably to the coarse threshold when the error signal exceeds the coarse threshold.

* * * * *